United States Patent
Sugita

(10) Patent No.: US 10,550,296 B2
(45) Date of Patent: Feb. 4, 2020

(54) THERMALLY CONDUCTIVE SHEET

(71) Applicant: DEXERIALS CORPORATION, Tokyo (JP)

(72) Inventor: Junichiro Sugita, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 431 days.

(21) Appl. No.: 14/770,794

(22) PCT Filed: Mar. 26, 2014

(86) PCT No.: PCT/JP2014/058625
§ 371 (c)(1),
(2) Date: Aug. 26, 2015

(87) PCT Pub. No.: WO2014/157378
PCT Pub. Date: Oct. 2, 2014

(65) Prior Publication Data
US 2016/0009963 A1  Jan. 14, 2016

(30) Foreign Application Priority Data

Mar. 28, 2013 (JP) .................................. 2013-068724

(51) Int. Cl.
*C09J 133/08* (2006.01)
*C09J 9/00* (2006.01)
(Continued)

(52) U.S. Cl.
CPC ............... *C09J 133/08* (2013.01); *B32B 7/12* (2013.01); *B32B 27/08* (2013.01); *B32B 27/22* (2013.01);
(Continued)

(58) Field of Classification Search
None
See application file for complete search history.

(56) References Cited

U.S. PATENT DOCUMENTS 5,814,685 A * 9/1998 Satake ................. C09D 11/326
347/100
6,207,272 B1 * 3/2001 Takahira ............... C09J 7/0217
427/208.4
(Continued)

FOREIGN PATENT DOCUMENTS

CN  102165028 A  8/2011
CN  102460655 A  5/2012
(Continued)

OTHER PUBLICATIONS

Aldrich Data Sheet (2017).*
(Continued)

*Primary Examiner* — Frank D Ducheneaux
(74) *Attorney, Agent, or Firm* — Procopio, Cory, Hargreaves & Savitch LLP

(57) ABSTRACT

A thermally conductive sheet in which an adhesive thermally conductive layer and a non-adhesive resin layer are stacked. The adhesive thermally conductive layer includes an acrylic resin formed by curing an acrylic compound and a thermally conductive filler, a glass transition temperature of the acrylic resin is from −80 to 15° C., a tack property of the adhesive thermally conductive layer is higher than a tack property of the non-adhesive resin layer, the tack property of the non-adhesive resin layer is from 6 to 30 kN/m2. The non-adhesive resin layer has a glass transition temperature from 60 to 110° C. The tack property is measured by pressing probe on a layer and peeling the probe under conditions of pressing speed of 30 mm/min, peeling speed of 120 mm/min, load of 196 g, pressing time of 5.0 sec, pulling distance of 5 mm, probe heating of 40° C. and sheet stage heating of 40° C.

12 Claims, 1 Drawing Sheet

(51) Int. Cl.

| | |
|---|---|
| *C09J 11/04* | (2006.01) |
| *C09J 11/06* | (2006.01) |
| *C09J 7/22* | (2018.01) |
| *C09J 7/30* | (2018.01) |
| *C09J 7/38* | (2018.01) |
| *C09J 4/00* | (2006.01) |
| *C09K 5/14* | (2006.01) |
| *C08K 3/013* | (2018.01) |
| *C08K 3/20* | (2006.01) |
| *C08K 3/22* | (2006.01) |
| *C08K 3/28* | (2006.01) |
| *C08K 3/34* | (2006.01) |
| *C08K 3/38* | (2006.01) |
| *C08K 3/04* | (2006.01) |
| *B32B 27/30* | (2006.01) |
| *B32B 27/40* | (2006.01) |
| *B32B 27/08* | (2006.01) |
| *B32B 27/36* | (2006.01) |
| *B32B 7/12* | (2006.01) |
| *B32B 27/22* | (2006.01) |
| *C08K 5/11* | (2006.01) |
| *H01L 21/683* | (2006.01) |
| *H01L 23/373* | (2006.01) |
| *C08K 3/08* | (2006.01) |
| *C08F 220/18* | (2006.01) |

(52) U.S. Cl.
CPC ............ *B32B 27/308* (2013.01); *B32B 27/36* (2013.01); *B32B 27/40* (2013.01); *C08K 3/041* (2017.05); *C08K 3/22* (2013.01); *C08K 3/28* (2013.01); *C08K 3/34* (2013.01); *C08K 3/38* (2013.01); *C08K 5/11* (2013.01); *C09J 7/22* (2018.01); *C09J 7/30* (2018.01); *C09J 7/38* (2018.01); *C09J 9/00* (2013.01); *C09J 11/04* (2013.01); *C09J 11/06* (2013.01); *C09K 5/14* (2013.01); *B32B 2307/302* (2013.01); *B32B 2457/00* (2013.01); *C08F 220/18* (2013.01); *C08K 3/013* (2018.01); *C08K 2003/085* (2013.01); *C08K 2003/0806* (2013.01); *C08K 2003/222* (2013.01); *C08K 2003/2224* (2013.01); *C08K 2003/2227* (2013.01); *C08K 2201/001* (2013.01); *C08L 2203/204* (2013.01); *C09J 4/00* (2013.01); *C09J 2201/606* (2013.01); *C09J 2203/326* (2013.01); *C09J 2205/102* (2013.01); *C09J 2431/006* (2013.01); *C09J 2433/00* (2013.01); *C09J 2467/006* (2013.01); *C09J 2475/006* (2013.01); *H01L 21/6836* (2013.01); *H01L 23/3735* (2013.01); *H01L 23/3737* (2013.01); *H01L 2924/0002* (2013.01)

(56) References Cited

U.S. PATENT DOCUMENTS

| | | | |
|---|---|---|---|
| 7,863,182 B2 * | 1/2011 | Matsumura | C09J 7/02 |
| | | | 438/628 |
| 2009/0081452 A1 * | 3/2009 | Husemann | B32B 7/12 |
| | | | 428/346 |
| 2009/0264573 A1 * | 10/2009 | Maeda | C08F 265/02 |
| | | | 524/436 |
| 2012/0202337 A1 | 8/2012 | Kim et al. | |
| 2012/0301716 A1 | 11/2012 | Terada et al. | |
| 2013/0041093 A1 | 2/2013 | Nakayama et al. | |
| 2013/0059120 A1 * | 3/2013 | Shi | B32B 7/12 |
| | | | 428/147 |
| 2014/0037950 A1 * | 2/2014 | Amano | C09J 165/00 |
| | | | 428/354 |

FOREIGN PATENT DOCUMENTS

| | | | |
|---|---|---|---|
| CN | 102753637 | 10/2012 | |
| CN | 102858896 A | 1/2013 | |
| JP | 2002194306 A | 7/2002 | |
| JP | 3498823 B2 | 2/2004 | |
| JP | 2004225022 A | 8/2004 | |
| JP | 2007169568 A | 7/2007 | |
| JP | 2010093077 A | 4/2010 | |
| KR | 1020110056375 A | 5/2011 | |
| KR | 1020120130331 A | 11/2012 | |
| TW | 201137078 A1 | 11/2011 | |
| WO | 2010035614 A1 | 4/2010 | |
| WO | 2011096287 A1 | 8/2011 | |
| WO | WO 2012/141101 A1 * | 10/2012 | ............... C09J 7/02 |

OTHER PUBLICATIONS

Notification of Reasons for Refusal for JP App No. 2013-068724 dated Nov. 11, 2016, 6 pgs.
Office Action and Search Report for related Taiwan Patent Application No. 103111905 dated Jun. 28, 2017, and corresponding English translation, in 9 pages.
International Search Report for PCT/JP2014/058625 dated Jul. 1, 2014, 5 pgs.
First Office Action for CN App No. 201480013296.9 dated May 30, 2016, 13 pgs.
Notification of Reason for Refusal for related KR App No. 10-2015-7024549 dated Mar. 18, 2019, 7 pgs.
First Office Action for related CN App No. 201710131494.0 dated Sep. 25, 2019, 14 pgs.

* cited by examiner

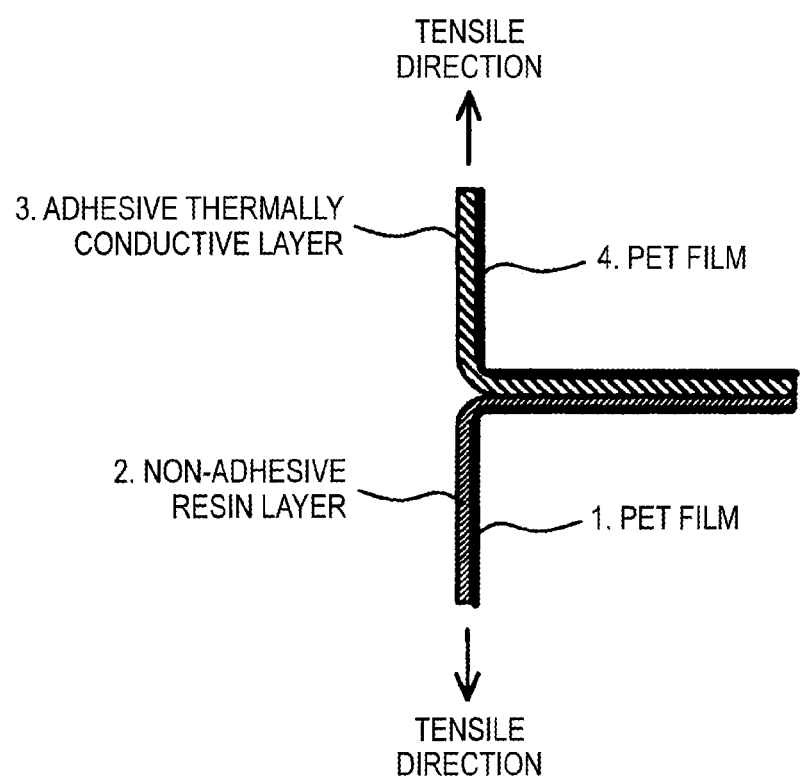

THERMALLY CONDUCTIVE SHEET

TECHNICAL FIELD

The present invention relates to a thermally conductive sheet which is adhered to an electronic component and the like to increase its heat dissipation performance.

BACKGROUND ART

The thermally conductive sheet is used for filling a gap between an electronic component, which is a heat source, and the like, and a heat sink, for example, a heat dissipation plate or a chassis to increase the heat dissipation performance of electronic component. As the thermally conductive sheet, a thermally conductive sheet having an adhesion property is preferred from the standpoint of workability in the case of assembling the electronic component and the heat sink using the thermally conductive sheet. Further, a thermally conductive sheet in which an adhesion property of one surface is high and an adhesion property of the other surface is low is preferred from the standpoint of reworkability, for example, to correct a position deviation at the time of assembling of the electronic component and the heat sink or to enable reassembling after once assembled and disassembled for any reason.

Thus, in the formation of thermally conductive sheet from a silicone rubber and a thermally conductive filler, it is proposed to apply a non-adhesive treatment to a surface of the sheet by ultraviolet ray irradiation (Patent Document 1).

Also, an adhesive thermally conductive sheet containing a non-functional acrylic polymer and a thermally conductive filler in an acrylic polyurethane resin, wherein a blend ratio of the acrylic polyurethane resin and the non-functional acrylic polymer is differentiated in a surface layer and a back layer and the both layers are coated superposedly to vary the adhesion property on the front side and the back side of adhesive thermally conductive sheet is proposed (Patent Document 2).

PRIOR ART DOCUMENT

Patent Document

Patent Document 1: Japanese Patent No. 3,498,823
Patent Document 2: JP-A-2010-93077

DISCLOSURE OF THE INVENTION

Problems that the Invention is to Solve

However, when the ultraviolet ray irradiation is performed in order to decrease the adhesion property of one surface of the thermally conductive sheet as described in Patent Document 1, the layer contributing the thermal conductivity is deteriorated.

Also, in the case where a blend ratio of the acrylic polyurethane resin and the non-functional acrylic polymer is differentiated in a surface layer and a back layer and the both layers are coated superposedly as described in Patent Document 2, since the surface layer and the back layer are easily mixed, it is difficult to vary the adhesion property in the surface layer and the back layer as desired.

In addition, as a method for differentiating the adhesion property on the front side and the back side of thermally conductive sheet, a method wherein in the case of forming an adhesive thermally conductive layer from an acrylic polymer and a thermally conductive filler, a non-adhesive film is stacked on one surface of the layer is considered, but in this case, since an attachment property of the film to an object is enormously decreased, the workability as the thermally conductive sheet is deteriorated.

In contrast, an object of the invention is to improve the workability and reworkability of thermally conductive sheet in which an adhesive thermally conductive layer is formed from an acrylic polymer and a thermally conductive filler by forming a layer having an appropriate adhesion property, which is lower than the adhesion property of the adhesive thermally conductive layer on one surface of the adhesive thermally conductive layer.

Means for Solving the Problems

The inventor has found that the object described above can be achieved by a thermally conductive sheet in which a non-adhesive resin layer is stacked on one surface of an adhesive thermally conductive layer formed from an acrylic polymer and a thermally conductive filler, wherein a tack property of the non-adhesive resin layer is set to lower than a tack property of the adhesive thermally conductive layer and a probe tack of the non-adhesive resin layer is set in a specific range; or a peel strength between the non-adhesive resin layer and the adhesive thermally conductive layer is set in a specific range to complete the invention.

Specifically, the invention provides a thermally conductive sheet in which an adhesive thermally conductive layer and a non-adhesive resin layer are stacked,
wherein the adhesive thermally conductive layer contains an acrylic resin formed by curing an acrylic compound and a thermally conductive filler, a glass transition temperature of the acrylic resin is from −80 to 15° C., a tack property of the adhesive thermally conductive layer is higher than a tack property of the non-adhesive resin layer, the non-adhesive resin layer has a glass transition temperature from 60 to 110° C., and
the tack property of the non-adhesive resin layer is from 6 to 30 kN/m$^2$ as a probe tack measured by pressing an aluminum cylindrical probe on the non-adhesive resin layer and peeling the aluminum cylindrical probe from the non-adhesive resin layer under conditions of pressing speed of 30 mm/min, peeling speed of 120 mm/min, load of 196 g, pressing time of 5.0 sec, pulling distance of 5 mm, probe heating of 40° C. and sheet stage heating of 40° C.

Also, the invention provides a thermally conductive sheet in which an adhesive thermally conductive layer and a non-adhesive resin layer are stacked,
wherein the adhesive thermally conductive layer contains an acrylic resin formed by curing an acrylic compound and a thermally conductive filler, a glass transition temperature of the acrylic resin is from −80 to 15° C., a tack property of the adhesive thermally conductive layer is higher than a tack property of the non-adhesive resin layer, the non-adhesive resin layer has a glass transition temperature from 60 to 110° C., and
a T-peel strength between the non-adhesive resin layer and the adhesive thermally conductive layer is 0.2 N/cm or more.

Advantage of the Invention

According to the thermally conductive sheet of the invention, since the adhesive thermally conductive layer and the non-adhesive resin layer having the tack property of specific measure, which is lower than the tack property of the adhesive thermally conductive layer are stacked, the workability in the case of assembling an electronic component and a heat sink using the thermally conductive sheet is improved and the reworkability in the case of reassembling the article once assembled is also improved.

BRIEF DESCRIPTION OF THE DRAWING

FIG. 1 is an explanatory drawing of a method for measuring a T-peel strength between the non-adhesive resin layer and the adhesive thermally conductive layer.

MODE FOR CARRYING OUT THE INVENTION

The invention will be described in detail hereinafter.

In the thermally conductive sheet according to the invention, the adhesive thermally conductive layer and the non-adhesive resin layer are stacked.

In the adhesive thermally conductive layer, a thermally conductive filler is dispersed in an acrylic resin formed by curing an acrylic compound. In the invention, from the standpoint of improving the workability in the case of assembling an electronic component and a heat sink using the thermally conductive sheet and the reworkability in the case of reassembling the article once assembled, as the acrylic compound, an acrylic compound a cured product of which, that is, an acrylic resin, has a glass transition temperature from −80 to 15° C., preferably from −70 to −10° C., is used. As such an acrylic compound, a monofunctional (meth)acrylate, for example, 2-ethylhexyl, lauryl, n-butyl, isobutyl, isononyl, 2-hydroxyethyl or 4-hydroxybutyl (meth)acrylate is exemplified. Among them, 2-ethylhexyl acrylate or lauryl acrylate is preferred. Also, one or more of monomers copolymerizable with the acrylic compound, for example, (meth)acrylic acid, N-vinylpyrrolidone, itaconic acid, tetrahydrofurfuryl acrylate, ethyl(meth)acrylate, 2-hydroxyethyl (meth)acrylate, 2-hydroxypropyl(meth)acrylate, isobornyl(meth)acrylate, ethoxyethyl(meth)acrylate, butoxyethyl(meth)acrylate, phenoxyethyl(meth)acrylate, phenyl (meth)acrylate and cyclohexyl (meth)acrylate may be used in mixture.

As the curing method of the acrylic compound, for example, a method of using a photopolymerization initiator or a photocuring agent, and irradiating an ultraviolet ray is exemplified. In this case, when a long wavelength ultraviolet ray (wavelength from 320 to 400 nm) is irradiated only in an energy amount necessary for cleavage of the photopolymerization initiator, the problem in that the adhesive thermally conductive layer is deteriorated by the ultraviolet ray irradiation is eliminated.

As the thermally conductive filler contained in the adhesive thermally conductive layer, a metal hydroxide, for example, aluminum hydroxide or magnesium hydroxide, metal, for example, aluminum, copper or silver, a metal oxide, for example, alumina or magnesia, a nitride, for example, aluminum nitride, boron nitride or silicon nitride, or a carbon nanotube can be used. The average particle diameter of the thermally conductive filler is preferably from 0.5 to 100 μm, and in particular, from the standpoint of dispersibility and thermal conductivity, it is preferred to use a small diameter filler having the average particle diameter from 3 to 20 μm and a large diameter filler having the average particle diameter from 25 to 100 μm in combination.

The content of the thermally conductive filler in the adhesive thermally conductive layer is preferably from 100 to 2,000 parts by weight, more from 300 to 1,000 parts by weight, based on 100 parts by weight of a monomer unit based on the acrylic compound described above. When the content of the thermally conductive filler is too small, the thermal conductivity of the thermally conductive sheet cannot be sufficiently increased, on the contrary, when it is too large, the flexibility of the thermally conductive sheet degrades, and thus it is not preferred.

In the case of using two kinds of thermally conductive fillers having different average particle diameters in the adhesive thermally conductive layer, a blend ratio of the small diameter filler and the large diameter filler is preferably from 15:85 to 90:10.

Also, it is preferred to incorporate into the adhesive thermally conductive layer one or more plasticizers selected from, for instance, an adipic acid compound, for example, dioctyl adipate or diisononyl adipate, a sebacic acid compound, for example, octyl sebacate or diisodecyl sebacate, a phosphoric acid compound, for example, tricresyl phosphate, castor oil or a derivative thereof, a higher fatty acid, for example, stearic acid or oleic acid, or a derivative thereof, a phthalic acid compound, for example, dibutyl phthalate or dioctyl phthalate, an acrylic acid compound, for example, a homopolymer or copolymer containing one or more monomers selected from the group consisting of butyl acrylate, 2-ethylhexyl acrylate and 2-methoxyethyl acrylate or a copolymer of the monomer described above and a monomer selected from the group consisting of monomers of an α-olefin, a vinyl ester and a vinyl ether, a low molecular weight acrylic polymer, wax and a tackifier. It is more preferred to incorporate one or more plasticizers selected from an adipic acid compound, a sebacic acid compound, a phosphoric acid compound, a castor oil compound, an oleic acid compound and an acrylic acid compound. The content of the plasticizer in the adhesive thermally conductive layer is preferably from 20 to 80 parts by weight, more from 30 to 70 parts by weight, based on 100 parts by weight of a monomer unit based on the acrylic compound described above.

In addition, an antioxidant, a thermal degradation inhibitor, a flame retardant, a coloring agent and the like may be blended into the adhesive thermally conductive layer, if desired.

The layer thickness of the adhesive thermally conductive layer is preferably from 200 to 3,000 μm. When it is too thin, a sufficient followability to irregularities of the material to be adhered cannot be obtained, and when it is too thick, it takes time for curing the layer, thereby deteriorating the productivity.

The tack property of each of the adhesive thermally conductive layer and the non-adhesive resin layer is measured as a probe tack by pressing an aluminum cylindrical probe on the adhesive thermally conductive layer or the non-adhesive resin layer and peeling the aluminum cylindrical probe from the adhesive thermally conductive layer or the non-adhesive resin layer under conditions of pressing speed of 30 mm/min, peeling speed of 120 mm/min, load of 1.96 g, pressing time of 5.0 sec, pulling distance of 5 mm, probe heating of 40° C. and sheet stage heating of 40° C.

The tack property of the adhesive thermally conductive layer is required to be higher than the tack property of the non-adhesive resin layer.

According to a first embodiment, the tack property of the non-adhesive resin layer is from 6 to 30 $kN/m^2$, preferably from 7 to 25 $kN/m^2$, as the probe tack.

In the case where the adhesion strength between the non-adhesive resin layer and the adhesive thermally conductive layer is small, there is a risk that a defect, for example, interlayer peeling occurs in handling during the work or rework. According to a second embodiment, in order to achieve a preferable handling property, the T-peel strength is required to be 0.2 N/cm or more, and is preferably from 0.2 to 6 N/cm.

By forming the thermally conductive sheet so that the tack property of the non-adhesive resin layer is set to have the probe tack property of the specific range as described above and the peel strength between the non-adhesive resin layer and the adhesive thermally conductive layer is set to the specific measure or more, in the case of assembling an electronic component and a heat sink using the thermally conductive sheet, it is preferred that the non-adhesive resin layer is not clammy, but exhibits an appropriately low adhesion property, whereby not only the workability is improved but also the reworkability in the case of reassembling the article once assembled is also improved.

In order to set the tack property of the non-adhesive resin layer to the range described above, as to the resin for forming the non-adhesive resin layer, the lower limit of the glass transition temperature is set to 60° C. or more, and more preferably 70° C. or more. Thus, it is possible to set the probe tack of the non-adhesive resin layer to 30 kN/m$^2$ or less, particularly 25 kN/m$^2$ or less without performing a curing treatment, for example, by blending a curing agent into the resin for forming the non-adhesive resin layer.

On the other hand, the upper limit of the glass transition temperature of the resin for forming the non-adhesive resin layer is 110° C. or less from the standpoint that the non-adhesive resin layer exhibits the appropriately low adhesion property and achieves the adhesion strength to the adhesive thermally conductive layer.

Also, the resin for forming the non-adhesive resin layer is preferably incompatible with the acrylic compound for forming the adhesive thermally conductive layer. Thus, even when coating compositions for forming respective layers are coated superposedly to form a stack of the adhesive thermally conductive layer and the non-adhesive resin layer, the respective layers are hard to be mixed at their interface to achieve the desired tack property. On the other hand, in the case where the resin for forming the non-adhesive resin layer is compatible with the acrylic compound for forming the adhesive thermally conductive layer, by previously performing a curing treatment to the coated layer for forming the non-adhesive resin layer before the superposed coating, the respective layers are hard to be mixed at their interface to achieve the desired tack property.

As a resin which is preferred for forming the non-adhesive resin layer, that is, a resin which has the glass transition temperature from 60 to 110° C. and is incompatible with the acrylic compound for forming the adhesive thermally conductive layer, a polyvinyl butyral resin, a polyester resin, a urethane resin and the like are exemplified. The molecular weight of the resin is preferably from 10,000 to 500,000 in terms of number average molecular weight.

Into the non-adhesive resin layer may be incorporated, if desired, a curing agent of the resin for forming the non-adhesive resin layer, an organic flame retardant, for example, melamine cyanurate, a thermally conductive filler, for example, aluminum hydroxide, and a coloring agent.

The layer thickness of the non-adhesive resin layer is preferably from 0.5 to 25 µm, and more preferably from 1 to 20 µm. When the layer thickness of the non-adhesive resin layer is too thin, the adhesion property increases due to compatibilizing with the adhesive thermally conductive layer and rubbing damage caused by the thermally conductive filler, and when, it is too thick, the thermal conductivity of the thermally conductive sheet becomes insufficient.

As to the thermal conductivity of the thermally conductive sheet, a heat conductivity in the thickness direction of the thermally conductive sheet is practically required to be 1 W/m·K or more according to measurement by the thermal gradation method in conformity with ASTM D5740, but according to the invention, the heat conductivity can be set to 1.5 W/m·K or more, and more preferably 2 W/m·K or more.

As to a method for manufacturing the thermally conductive sheet according to the invention, the thermally conductive sheet according to the invention can be obtained, for example, by preparing a coating material for forming the adhesive thermally conductive layer in which the respective components for forming the adhesive thermally conductive layer described above are mixed and a coating material for forming the non-adhesive resin layer in which the respective components for forming the non-adhesive resin layer are mixed with a solvent, respectively, coating the coating material for forming the non-adhesive resin layer on a release film formed from polyethylene terephthalate (PET), polyethylene naphthalate (PEN), polyolefin, glassine paper or the like followed by drying, then coating the coating material for forming the adhesive thermally conductive layer on the coated surface of the non-adhesive resin layer, covering the coated surface of the coating material for forming the adhesive thermally conductive layer with a cover film of PET, PEN, polyolefin or the like, and irradiating an ultraviolet ray through the cover film to cure the coated layer of the coating material for forming the adhesive thermally conductive layer.

Also, the thermally conductive sheet according to the invention can be manufactured by coating the coating material for forming the non-adhesive resin layer on a release film followed by drying, separately coating the coating material for forming the adhesive thermally conductive layer on another release film, covering the non-adhesive resin layer with the adhesive thermally conductive layer so as to face the coated surfaces of the layers, respectively, in place of a cover film, and irradiating an ultraviolet ray to cure the coated layer of the coating material for forming the adhesive thermally conductive layer.

After the manufacturing the thermally conductive sheet as described above, the release film is peeled off from the non-adhesive resin layer, the thermally conductive sheet is wound to be stored. The thermally conductive sheet wound as described above is used for assembly of an electronic component and a heat sink by peeling off the release film on the side of the adhesive thermally conductive layer.

EXAMPLES

The invention will be described specifically with reference to the example below.

Examples 1 to 7 and Comparative Examples 1 to 3

The resin and the curing agent shown in Table 1 were dissolved in a mixed solvent of toluene and methyl ethyl ketone (1:1) to prepare a coating solution having a solid content of 10% by weight, and the coating solution was coated on a PET film by a bar coater and dried at 90° C. for 5 minutes to from a non-adhesive resin layer having the coating thickness shown in Table 1.

On the other hand, 100 parts by weight of 2-ethylhexyl acrylate as a monofunctional acrylate, 47 parts by weight of castor oil-derived fatty acid ester as a plasticizer, 1.4 parts by weight of a photopolymerization initiator (IRGACURE 819, BASF), 1.5 parts by weight of hydroxypivalic acid neopentyl glycol diacrylate (KAYARAD FM-400, Nippon Kayaku Co., Ltd.) as a curing agent, 400 parts by weight of aluminum hydroxide powder (average particle diameter: 80 μm) as a thermally conductive filler, and 400 parts by weight of aluminum hydroxide powder (average particle diameter: 8 μm) were mixed to prepare a coating material for forming the adhesive thermally conductive layer. The glass transition temperature of a cured product of the 2-ethylhexyl acrylate was from −50 to −40° C.

The coating material for forming the adhesive thermally conductive layer thus prepared was coated superposedly on the non-adhesive resin layer described above with a coating thickness of 2 mm, a cover film made of PET was covered on the adhesive thermally conductive layer, and a long wavelength ultraviolet ray was irradiated for 5 minutes with a chemical lamp from both the PET film side and the cover film side, thereby manufacturing the thermally conductive sheets of Examples 1 to 7 and Comparative Examples 1 to 3, respectively.

Comparative Example 4

The coating material for forming the adhesive thermally conductive layer prepared in the same manner as in Example 1 was coated on a PET film without providing the non-adhesive resin layer, a cover film made of PET was covered on the adhesive thermally conductive layer, and a long wavelength ultraviolet ray was irradiated for 5 minutes with a chemical lamp from both the PET film side and the cover film side, thereby manufacturing the thermally conductive sheet of Comparative Example 4.

Evaluation

With respect to the thermally conductive sheet of each of the examples and the comparative examples, (a) tack properties of the non-adhesive resin layer and the adhesive thermally conductive layer, (b) heat conductivity of the thermally conductive sheet, (c) reworkability of the thermally conductive sheet, and (d) interlayer peel strength between the non-adhesive resin layer and the adhesive thermally conductive layer of the thermally conductive sheet were evaluated in the manner described below. The results are shown in Table 1.

(a) Tack Properties of the Non-Adhesive Resin Layer and the Adhesive Thermally Conductive Layer Using Tacking Test Machine TAC-II produced by Rhesca Co., Ltd. as the tack property test machine, a probe tack was measured by pressing an aluminum cylindrical probe having a diameter of 10 mm on the non-adhesive resin layer of the thermally conductive sheet of each of Examples 1 to 7 and Comparative Examples 1 to 3 and then peeling the aluminum cylindrical probe from the non-adhesive resin layer under conditions of pressing speed of 30 mm/min, peeling speed of 120 mm/min, load of 196 g, pressing time of 5.0 sec, pulling distance of 5 mm, probe heating of 40° C. and sheet stage heating of 40° C. As to the thermally conductive sheet of Comparative Example 4, since the non-adhesive resin layer was not present, the tack property of the adhesive thermally conductive layer was measured.

(b) Heat Conductivity of the Thermally Conductive Sheet

The heat conductivity in the thickness direction of the thermally conductive sheet was measured by a heat conductivity meter (produced by Sony Corp.) in conformity with ASTM 05740 (heater output of 8 W, sheet surface pressure of 1 kgf/cm$^2$).

(c) Reworkability of the Thermally Conductive Sheet

Between upper and lower copper rods facing parallel was sandwiched the thermally conductive sheet so as to dispose the non-adhesive resin layer on the downside, and after allowing to stand at a pressure of 1 kgf/cm$^2$ for 10 minutes, the rods were peeled off. At the time, peeling occurred between the non-adhesive resin layer of the thermally conductive sheet and the copper plate was evaluated as O, and the rest was evaluated as X.

(d) T-Peel Strength Between the Non-Adhesive Resin Layer and the Adhesive Thermally Conductive Layer of the Thermally Conductive Sheet Using a tensile test machine (RTG-1225, Orientec Co., Ltd.), as shown in FIG. 1, in the state where the PET film 1 was stacked to the non-adhesive resin layer 2 and the cover film 4 is stacked to the adhesive thermally conductive layer 3, the interlayer peel strength between the non-adhesive resin layer 2 and the adhesive thermally conductive layer 3 was measured by a T-peel test. In this case, the tensile speed was 500 mm/sec and the sample width was 2 cm.

From Table 1, it can be seen that in Examples 1, 2 and 4 to 7 wherein the glass transition temperature of the resin forming the non-adhesive resin layer is from 60 to 110° C., even when a curing agent is not blended, the tack value of the non-adhesive resin layer is from 6 to 25 kN/m$^2$, and the interlayer peel strength (T-peel strength) between the non-adhesive resin layer and the adhesive thermally conductive layer is 0.2 N/cm or more, so that the reworkability is good.

Also, it can be seen that in the case where the layer thickness of the non-adhesive resin layer is 20 μm or less, the thermally conductive sheet has the sufficient thermal conductivity.

On the other hand, in Comparative Examples 1 and 2 wherein the tack value of the non-adhesive resin layer exceeds 30 kN/m$^2$ and in Comparative Example 4 wherein the non-adhesive resin layer is not present, since the thermally conductive sheet is adhered to a material to be adhered, the reworkability is poor, and in Comparative Example 3 wherein the interlayer peel strength between the non-adhesive resin layer and the adhesive thermally conductive layer by the T-peel test is less than 0.2 N/cm, the non-adhesive resin layer is easily peeled off from the adhesive thermally conductive layer so that the workability is bad.

| | Adhesive Thermally Conductive Layer | | | Non-adhesive Resin Layer | | | | | Thermally Conductive sheet | | | |
|---|---|---|---|---|---|---|---|---|---|---|---|---|
| | Resin | Coating Thickness (mm) | Tack Value (kN/m$^2$) | Resin | Tg (° C.) | Curing Agent | Coating Thickness (μm) | Tack Value (kN/m$^2$) | Heat Conductivity λ (W/m·K) | Reworkability | Workability | Interlayer Peel Strength (N/cm) |
| Example 1 | Acrylic Resin | 2 | | Polyvinyl Butyral *1 | 66 | | 0.7 | 10.3 | 2.2 | ○ | ○ | 0.43 |
| Example 2 | Acrylic Resin | 2 | | Polyvinyl Butyral *2 | 90 | | 5 | 10.5 | 2.2 | ○ | ○ | 0.43 |

-continued

| | Adhesive Thermally Conductive Layer | | | Non-adhesive Resin Layer | | | | | Thermally Conductive sheet | | | |
|---|---|---|---|---|---|---|---|---|---|---|---|---|
| | Resin | Coating Thickness (mm) | Tack Value (kN/m²) | Resin | Tg (°C.) | Curing Agent | Coating Thickness (μm) | Tack Value (kN/m²) | Heat Conductivity λ (W/m·K) | Reworkability | Workability | Interlayer Peel Strength (N/cm) |
| Example 3 | Acrylic Resin | 2 | | Polyvinyl Butyral *2 | 90 | Isocyanate *a | 5 | 8.8 | 2.1 | ○ | ○ | 0.45 |
| Example 4 | Acrylic Resin | 2 | | Polyvinyl Butyral *3 | 110 | | 5 | 8.8 | 2.2 | ○ | ○ | 0.4 |
| Example 5 | Acrylic Resin | 2 | | Polyvinyl Butyral *4 | 83 | | 11 | 10.9 | 2.1 | ○ | ○ | 0.2 |
| Example 6 | Acrylic Resin | 2 | | Polyester *5 | 67 | | 1 | 16.1 | 2.0 | ○ | ○ | 0.2 |
| Example 7 | Acrylic Resin | 2 | | Urethane Polyester *6 | 92 | | 18 | 10.5 | 2.0 | ○ | ○ | 0.5 |
| Comparative Example 1 | Acrylic Resin | 2 | | Urethane Polyester *6 | −3 | | 8 | 41.4 | 2.2 | X | ○ | Not peeled |
| Comparative Example 2 | Acrylic Resin | 2 | | Acrylic Rubber *7 | 5 | | 7 | 66.1 | 2.1 | X | ○ | Not peeled |
| Comparative Example 3 | Acrylic Resin | 2 | | PET *8 | 70 | | 5 | 5.4 | 2.0 | ○ | X | 0.1 |
| Comparative Example 4 | Acrylic Resin | 2 | 67.4 | None | | | | — | 2.3 | X | ○ | — |

Note
*1: ESLEC BL-1 produced by Sekisui Chemical Co., Ltd.
*2: ESLEC BX-1 produced by Sekisui Chemical Co., Ltd.
*3: ESLEC KS-3 produced by Sekisui Chemical Co., Ltd.
*4: VYLON UR-1400 produced by Toyobo Co., Ltd.
*5: VYLON 200 produced by Toyobo Co., Ltd.
*6: VYLON produced by Toyobo Co., Ltd.
*7: TEISANRESIN SG-700AS produced by Nagase ChemteX Corp.
*8: LUMILAR produced by Toray Industries, Inc.
*a: CORONATE HX produced by Nippon Polyurethane Industry Co., Ltd.

INDUSTRIAL APPLICABILITY

According to the thermally conductive sheet of the invention, since the adhesive thermally conductive layer and the non-adhesive resin layer having the tack property of specific measure, which is lower than the tack property of the adhesive thermally conductive layer are stacked, the workability in the case of assembling an electronic component and a heat sink using the thermally conductive sheet is improved and the reworkability in the case of reassembling the article once assembled is also improved.

Although the invention has been described in detail and by reference to specific embodiments, it is apparent to those skilled in the art that it is possible to add various alterations and modifications insofar as the alterations and modifications do not deviate from the spirit and the scope of the invention.

This application is based on a Japanese patent application filed on Mar. 28, 2013 (Japanese Patent Application No. 2013-68724), and the contents thereof are incorporated herein by reference.

DESCRIPTION OF REFERENCE NUMERALS AND SIGNS

1: PET film
2: Non-adhesive resin layer
3: Adhesive thermally conductive layer
4: Cover film (PET)

The invention claimed is:

1. A thermally conductive sheet comprising an adhesive thermally conductive layer and a non-adhesive resin layer which are stacked between a first release film layer and a second release film layer, each release layer being formed from one of a polyethylene terephthalate, polyethylene naphthalate, polyolefin, or glassine paper layer,
   wherein the first release film layer or the second release film layer is in direct contact with the non-adhesive resin layer;
   wherein the adhesive thermally conductive layer comprises an acrylic resin formed by curing a composition comprising:
   an acrylic compound and
   a thermally conductive filler,
   wherein a glass transition temperature of the acrylic resin is from −80 to 15° C., a tack property of the adhesive thermally conductive layer is higher than a tack property of the non-adhesive resin layer, the tack property of the non-adhesive resin layer is from 6 to 30 kN/m²,
   the non-adhesive resin layer has a glass transition temperature from 60 to 110° C., wherein a resin forming the non-adhesive resin layer is selected from a polyvinyl butyral resin, a polyester resin and a urethane resin, wherein the resin forming the non-adhesive resin layer is incompatible with the acrylic resin, wherein the non-adhesive resin layer has a low adhesion property, and wherein
   the tack property is measured as a probe tack by pressing an aluminum cylindrical probe on the adhesive thermally conductive layer or the non-adhesive resin layer and peeling the aluminum cylindrical probe from the adhesive thermally conductive layer or the non-adhesive resin layer under conditions of pressing speed of 30 mm/min, peeling speed of 120 mm/min, load of 196 g, pressing time of 5.0 sec, pulling distance of 5 mm, probe heating of 40° C. and sheet stage heating of 40° C.

2. The thermally conductive sheet as claimed in claim 1, wherein a heat conductivity in a thickness direction of the thermally conductive sheet is 1.5 W/m·K or more.

3. The thermally conductive sheet as claimed in claim 1, wherein the acrylic compound forming the adhesive thermally conductive layer is a monofunctional (meth)acrylate monomer.

4. The thermally conductive sheet as claimed in claim 1, wherein the adhesive thermally conductive layer comprises from 20 to 80 parts by weight of one or more plasticizers selected from an adipic acid compound, a sebacic acid compound, a phosphoric acid compound, a castor oil compound, an oleic acid compound and an acrylic acid compound based on 100 parts by weight of a monomer unit of the acrylic compound.

5. The thermally conductive sheet as claimed in claim 2, wherein the acrylic compound forming the adhesive thermally conductive layer is a monofunctional (meth)acrylate monomer.

6. The thermally conductive sheet as claimed in claim 2, wherein the adhesive thermally conductive layer comprises from 20 to 80 parts by weight of one or more plasticizers selected from an adipic acid compound, a sebacic acid compound, a phosphoric acid compound, a castor oil compound, an oleic acid compound and an acrylic acid compound based on 100 parts by weight of a monomer unit of the acrylic compound.

7. A thermally conductive sheet comprising an adhesive thermally conductive layer and a non-adhesive resin layer which are stacked between a first release film layer and a second release film layer, each release layer being formed from one of a polyethylene terephthalate, polyethylene naphthalate, polyolefin, or glassine paper layer,
wherein the first release film layer or the second release film layer is in direct contact with the non-adhesive resin layer;
wherein the adhesive thermally conductive layer comprises an acrylic resin formed by curing a composition comprising:
an acrylic compound and
a thermally conductive filler,
wherein a glass transition temperature of the acrylic resin is from −80 to 15° C., a tack property of the adhesive thermally conductive layer is higher than a tack property of the non-adhesive resin layer,
the non-adhesive resin layer has a glass transition temperature from 60 to 110° C.,
a resin forming the non-adhesive resin layer is incompatible with the acrylic resin,
the non-adhesive resin layer has a low adhesion property,
a T-peel strength between the non-adhesive resin layer and the adhesive thermally conductive layer is 0.2 N/cm or more,
the tack property is measured as a probe tack by pressing an aluminum cylindrical probe on the adhesive thermally conductive layer or the non-adhesive resin layer and peeling the aluminum cylindrical probe from the adhesive thermally conductive layer or the non-adhesive resin layer under conditions of pressing speed of 30 mm/min, peeling speed of 120 mm/min, load of 196 g, pressing time of 5.0 sec, pulling distance of 5 mm, probe heating of 40° C. and sheet stage heating of 40° C., and
wherein a resin forming the non-adhesive resin layer is selected from a polyvinyl butyral resin, a polyester resin and a urethane resin.

8. The thermally conductive sheet as claimed in claim 7, wherein a heat conductivity in a thickness direction of the thermally conductive sheet is 1.5 W/m·K or more.

9. The thermally conductive sheet as claimed in claim 7, wherein the acrylic compound forming the adhesive thermally conductive layer is a monofunctional (meth)acrylate monomer.

10. The thermally conductive sheet as claimed in claim 8, wherein the acrylic compound forming the adhesive thermally conductive layer is a monofunctional (meth)acrylate monomer.

11. The thermally conductive sheet as claimed in claim 8, wherein the adhesive thermally conductive layer comprises from 20 to 80 parts by weight of one or more plasticizers selected from an adipic acid compound, a sebacic acid compound, a phosphoric acid compound, a castor oil compound, an oleic acid compound and an acrylic acid compound based on 100 parts by weight of a monomer unit of the acrylic compound.

12. The thermally conductive sheet as claimed in claim 7, wherein the adhesive thermally conductive layer comprises from 20 to 80 parts by weight of one or more plasticizers selected from an adipic acid compound, a sebacic acid compound, a phosphoric acid compound, a castor oil compound, an oleic acid compound and an acrylic acid compound based on 100 parts by weight of a monomer unit of the acrylic compound.

* * * * *